United States Patent [19]

Yang et al.

[11] Patent Number: 4,965,648
[45] Date of Patent: Oct. 23, 1990

[54] TILTED CHANNEL, SERIAL-PARALLEL-SERIAL, CHARGE-COUPLED DEVICE

[75] Inventors: Kei-Wean C. Yang; John E. Taggart; Raymond Hayes; Joseph R. Peter, all of Beaverton, Oreg.

[73] Assignee: Tektronix, Inc., Beaverton, Oreg.

[21] Appl. No.: 215,967

[22] Filed: Jul. 7, 1988

[51] Int. Cl.[5] .................. H01L 29/78; H01L 29/34
[52] U.S. Cl. .................................... 357/24; 357/52;
357/90; 377/58; 377/61; 377/62; 377/63
[58] Field of Search ............. 357/24, 24 M, 24 LR,
357/52, 90; 377/58, 61, 62, 63

[56] References Cited

U.S. PATENT DOCUMENTS

| 3,796,932 | 3/1974 | Amelio et al | 357/24 M |
|---|---|---|---|
| 3,924,319 | 12/1975 | Mohsen | 357/24 |
| 4,092,734 | 5/1978 | Collins et al. | 357/24 |
| 4,184,896 | 1/1980 | Millea | 357/24 |
| 4,236,830 | 12/1980 | Schlig | 357/24 |
| 4,364,164 | 12/1982 | Bluzer et al. | 357/24 |

FOREIGN PATENT DOCUMENTS

| 63-140574 | 6/1988 | Japan | 357/24 |
|---|---|---|---|
| 52-72187 | 6/2977 | Japan | 357/24 |
| 2009500 | 6/1979 | United Kingdom | 357/24 |
| 2029101 | 3/1980 | United Kingdom | 357/24 |

Primary Examiner—Andrew J. James
Assistant Examiner—Ngan Van Ngo
Attorney, Agent, or Firm—Daniel J. Bedell; Peter J. Meza

[57] ABSTRACT

A serial-parallel-serial, charged-coupled device includes an array of horizontal rows and columns of closely spaced charge storage cells. Each storage cell is formed by an electrode covering an insulation layer above a semiconductor substrate. The semiconductor substrate of each storage cell includes a channel region for conducting carriers laterally through the storage cell. The channel region of each storage cell included both in a first row of the array and in any column of the array has a tilted potential gradient providing an electric field facilitating charge carrier drift within the channel region in two lateral directions, toward a neighboring storage cell of the first row and also toward a neighboring storage cell of its column.

15 Claims, 8 Drawing Sheets

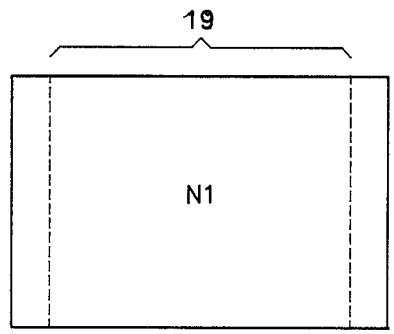
FIG.13
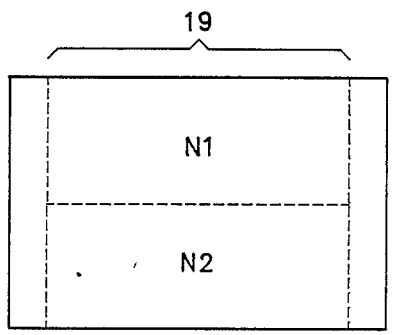
FIG.14
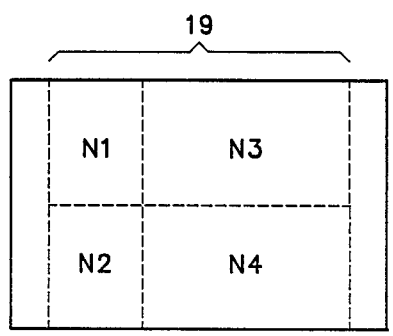
FIG.15
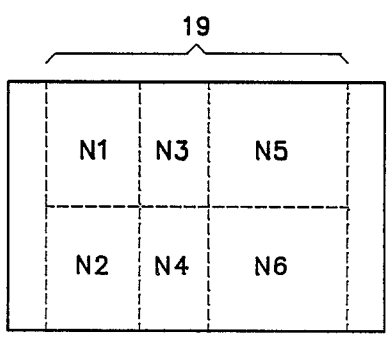
FIG.16
FIG.19
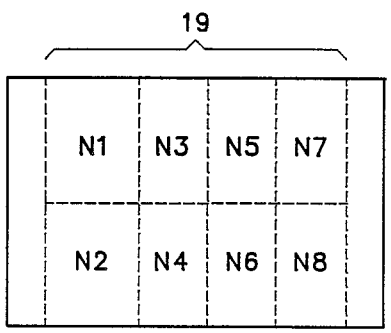
FIG.17
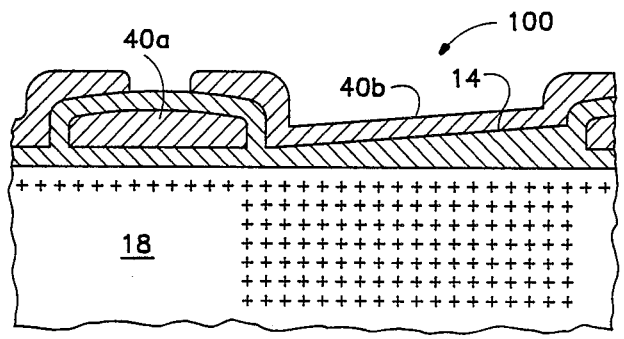
FIG.18

TILTED CHANNEL, SERIAL-PARALLEL-SERIAL, CHARGE-COUPLED DEVICE

CROSS-REFERENCES TO RELATED APPLICATION

A tilted channel charge-coupled device is described in co-pending U.S. patent application Ser. No. 216,079, filed 7/7/88, entitled "Tilted Channel Charge-Coupled Device".

BACKGROUND OF THE INVENTION

The present invention relates to charge-coupled devices and in particular to a storage cell for a serial-parallel-serial, charge-coupled device exhibiting a bidirectionally tilted channel potential.

A charge-coupled device is an integrated circuit including a row of closely spaced charge storage cells. Each storage cell includes an electrode formed on an insulation layer covering a semiconductor substrate, the substrate of each cell having a channel region for storing packets of charge carriers. When electrodes of neighboring storage cells are biased by clock signals of differing phase, an electric field develops between channel regions within or on the surface of the substrate beneath the electrodes of the storage cells, and this electric field drives charge carriers in the channel region of one cell into the channel region of its neighboring cell. By applying appropriately phased clock signals to electrodes of neighboring cells of a charge-coupled device, charge packets are shifted laterally from cell-to-cell.

A "serial-parallel-serial", charge-coupled device (SPSCCD) employs a planar, two-dimensional array of storage cells, rather than just a single row of storage cells. After a sequence of charge packets is serially shifted into a first row of cells, the charge packets stored in cells of the first row are shifted in parallel from row-to-row until they reach the last row of the array. The charge packets are then serially shifted out of the last row.

A serial-parallel-serial, charge-coupled device may be used in a high frequency digital oscilloscope for storing a sequence of charge packets acquired by periodically sampling an analog input signal. The oscilloscope rapidly shifts charge packets into the SPSCCD as it samples the analog signals at a high sampling frequency, the amount of charge in each packet being proportional to a sampled voltage of the input signal. When every row of the SPSCCD stores a sequence of charge packets, the charge packets are shifted out of the SPSCCD at a slower rate and converted to a corresponding voltage input to an A/D converter. In response, the A/D converter generates a sequence of digital data representing the analog input signal, and the data sequence controls a waveform display. Since the SPSCCD acts as a buffer slowing application of voltage input to the A/D converter, the A/D converter may operate at a frequency lower than the sampling frequency.

During initial stages of high speed serial charge packet transfer between adjacent storage cells of the first row of the SPSCCD, or parallel charge packet transfer between cells of the first and second row, clock-induced potential gradients between the channel regions of adjacent storage cells provide strong electric fields driving carriers quickly from one cell to another. A high carrier concentration gradient between channel regions of adjacent cells also encourages carrier flow by diffusion. However, as charge carriers begin to accumulate in a receiving cell, both the carrier concentration gradient and the clock-induced potential gradient between the channel regions of adjacent storage cells decrease, thereby slowing diffusion and drift of remaining carriers into the channel region of the receiving cell. As the frequency of clock signals applied to the electrodes of storage cells increases, the time available for charge carriers to move from one cell to its neighboring cell decreases. At high clock frequencies, a substantial portion of carriers of a charge packet remains behind at the end of a clock phase.

The "charge transfer efficiency" of a charge-coupled device is the ratio of charge transferred to a storage cell from its neighboring cell during a clock phase to the initial charge in the neighboring cell at the beginning of the clock phase. As the frequency of operation of a charge-coupled device increases, charge transfer efficiency decreases. A high charge transfer efficiency is desirable, particularly in large SPSCCDs having many storage cells, to prevent substantial degradation of charges passing through the device. Charge transfer efficiency of an SPSCCD can limit its frequency of operation.

SUMMARY OF THE INVENTION

A serial-parallel-serial, charge-coupled device (SPSCCD) includes a two-dimensional array of rows and columns of storage cells, each storage cell including an electrode formed above an insulation layer covering a semiconductor substrate. When electrodes of neighboring cells are biased by differently phased clock signals, a charge packet stored in a channel region of the substrate of one storage cell passes in a lateral direction into a channel region of its neighboring storage cell. In accordance with one aspect of the invention, the channel region in an SPSCCD storage cell included in both a first row and a column of the array has potential gradients tilted toward neighboring cells of the first row and the column of the array.

The potential gradients provide electric fields applying lateral forces on charge carriers within the channel region, thereby increasing the rate of charge carrier drift in two lateral directions toward the neighboring storage cells. The drift rate increase is most apparent during the latter portion of a clock phase when carrier concentration and clock-induced potential gradients between channel regions of the cell and its neighbors are reduced. The electric fields provided by the tilted potential gradients improve transfer efficiency of charge packets in both lateral directions, particularly at high clock frequencies.

In accordance with another aspect of the invention, in a preferred embodiment thereof, the tilted potential gradients are built-in potential gradients produced by non-uniformly doping the channel of the storage cell in the two lateral directions.

In accordance with a further aspect of the invention, in alternative embodiments, the tilted potential gradients are produced by providing under each electrode an insulation layer of thickness laterally graded in the two directions, by providing electrodes having laterally graded work functions, or by providing laterally graded clock signal potentials on each electrode.

It is accordingly an object of the invention to provide an improved serial-parallel-serial, charge-coupled device having high charge transfer efficiency when operating at high clock frequency.

The subject matter of the present invention is particularly pointed out and distinctly claimed in the concluding portion of this specification. However, both the organization and method of operation of the invention, together with further advantages and objects thereof, may best be understood by reference to the following description in view of the accompanying drawings wherein like reference characters refer to like elements.

BRIEF DESCRIPTION OF THE DRAWING

FIGS. 13–17 are diagrammatic planar views showing channel dopant concentration following the stages of fabrication illustrated in FIGS. 7–11, respectively;

FIG. 18 is a sectional view of a single storage cell of an SPSCCD utilizing an insulation layer having graded thickness in accordance with an alternative embodiment of the present invention;

FIG. 19 is a diagrammatic planar view of the storage cell of FIG. 18 showing directions of gradation of insulation layer thickness;

DESCRIPTION OF THE PREFERRED EMBODIMENTS

Figure 1:
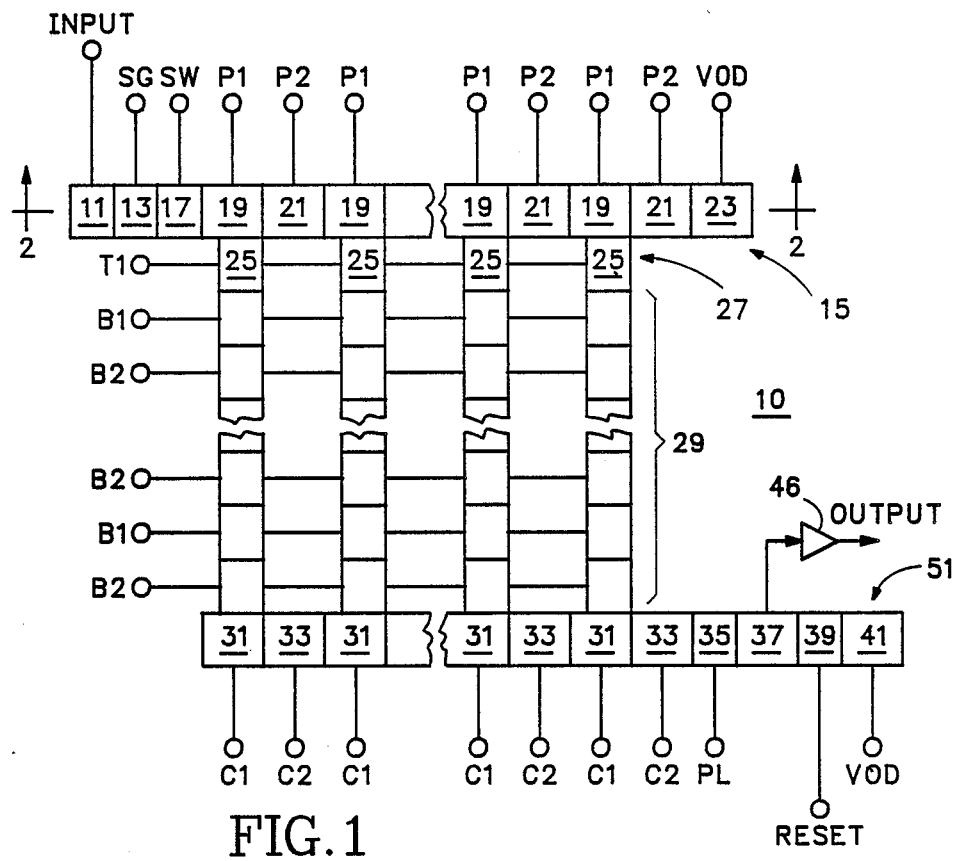
FIG. 1 is a simplified planar view of a two-phase SPSCCD in accordance with the present invention.

The present invention relates to a serial-parallel-serial, charge-coupled device (SPSCCD) comprising an integrated circuit formed by a two-dimensional array of charge storage cells as illustrated in simplified plan view in FIG. 1. The SPSCCD 10 periodically samples an input signal applied to an input diffusion 11, sequentially stores charge packets in a sample gate cell 13 of a first row 15 of the array and then serially shifts the charge packets from cell-to-cell through row 15. The amount of charge stored in the sample gate cell 13 during each sampling operation is proportional to the voltage of the input signal.

First row 15 also includes a sample well cell 17, a set of charge storage cell pairs 19/21 and an output diffusion 23. When neighboring storage cells of the first row are biased by differently phased clock signals, a charge packet stored in one storage cell passes in a lateral direction into its neighboring cell. A set of phased clock signals SG, SW, P1, and P2 control sampling of the input signal connected to input diffusion 11 and shifting of each resulting charge packet through row 15 in a well-known manner. The SG and SW clock signals control storage cells 13 and 17, respectively, and the P1 and P2 clock signals control storage cells 19 and 21, respectively.

After SPSCCD 10 has serially shifted a sequence of charge packets into storage cells 19 of first row 15, the charge packets are shifted in parallel to neighboring storage cells 25 of a second row 27 of the array and another sequence of charge packets is acquired and shifted serially into the first row. As the process continues, charge packet sequences are shifted in parallel from the second row 27 through additional rows 29 of the array to storage cells 31 of a last row 51 of the array. A clock signal Ti controls cells 25 of the second row 27, and clock signals B1 and B2 control cells of alternate rows 29.

Last row 51 includes a sequence of storage cell pairs 31/33, a "last gate" cell 35, a floating diffusion 37, a "reset" cell 39 and an output diffusion 41. Alternate phase clock signals C1 and C2, connected to each storage cell 31 and 33, respectively, control charge packet movement through last row 51 in a well-known manner.

Input signal sampling and charge packet acquisition cease when all storage cells of rows 29 store charge packets. At this point, the sequence of charge packets stored in last row 51 is shifted serially to the right. The floating diffusion 37 is suitably connected to an amplifier 46 producing an output voltage proportional to the charge in the floating diffusion. As charge packets pass sequentially into floating diffusion 37, amplifier 46 produces a sequence of output voltages representing the magnitudes of the charge packets, and therefore also representing sampled magnitudes of the input signal. Charge packets pass through floating diffusion 37 and into output diffusion 41 via reset cell 39 and are removed from diffusion 41 by a source VOD connected thereto. After each sequence of charge packets is serially shifted out of last row 51, a next sequence of charge packets is parallel shifted into the last row and then serially shifted out of the last row. The process continues until all charge packets are shifted out of the SPSCCD 10. Thereafter, input signal sampling and charge packet acquisition may restart.

SPSCCD 10 is suitable for use in a high frequency digital oscilloscope. An input signal is sampled at a high sampling frequency, and charge packets are serially shifted rapidly into SPSCCD 10. When SPSCCD 10 is filled with sequences of charge packets, the charge packets are serially shifted through output diffusion 37 of last row 51 at a frequency somewhat slower than the sampling frequency. The sequence of output voltages generated by amplifier 41 during a shift out operation drives the input of an A/D converter (not shown) which produces in response a digital data sequence representing the analog input signal. The oscilloscope then generates a waveform display based on the data sequence. Since the A/D converter cannot operate at the high frequency at which the SPSCCD stores samples, the SPSCCD acts as a buffer to slow application of samples to the A/D converter. Thus, the digital oscilloscope can generate waveform displays representing input signals sampled at a high frequency even though it employs a relatively low speed A/D converter.

From the foregoing discussion of the manner of operation of SPSCCD 10 it is seen that charge packets are serially shifted into first row 15 more quickly than they are serially shifted out of last row 51. During data acquisition, charge packets sequences must be shifted quickly from first row 15 to second row 27 each time a charge packet sequence is shifted into in the first row so that a next sequence of charge packets can be acquired without halting periodic sampling of the input signal. The sampling frequency of SPSCCD 10 is limited by the rate charge packets move laterally from cell-to-cell within the first row 15 and from row-to row.

Figure 2:
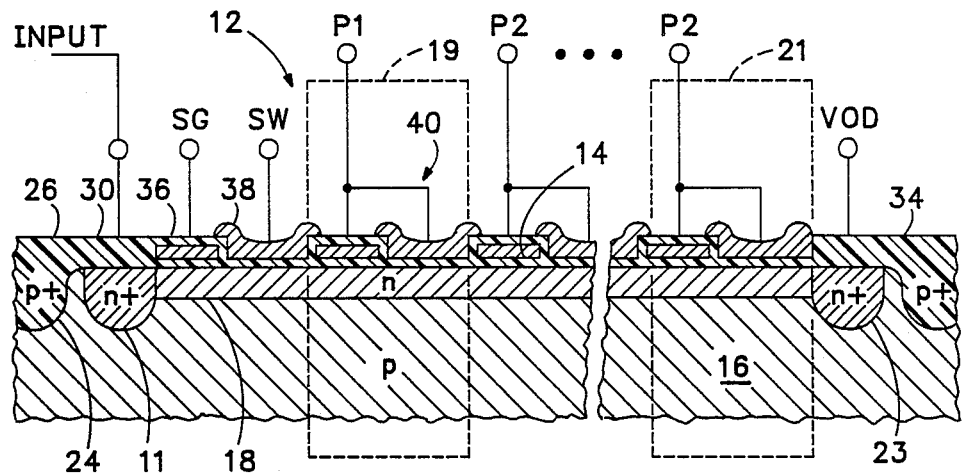
FIG. 2 is a sectional view of the first row of the two-phase SPSCCD of FIG. 1 taken along section lines 2—2.

FIG. 2 illustrates section 2—2 of first row 15 of SPSCCD 10 of FIG. 1. (The view is exaggerated vertically more than horizontally in order to more clearly show structural detail. First row 15 comprises an array 12 of closely spaced polysilicon electrodes laterally aligned on a silicon dioxide insulation layer 14 grown on the surface of a p-type silicon semiconductor substrate 16. Electrodes of array 12 are isolated one from another by extensions of insulation layer 14. A portion of substrate 16 under array 12 is doped to form an n-type channel region 18 between n+ input and output diffusion regions 11 and 23. Channel region 18 preferably has a buried channel for conducting charge packets laterally under the electrode array 12. However, in alternative embodiments of the invention, channel region 18 may have a surface channel. SPSCCD 10 is surrounded by a p+ guard ring diffusion region 24 covered by a field oxidation layer 26. Metallic contacts 30 and 34 extend through insulation layer 14 to connect the input signal and voltage source VOD to input and output diffusion regions 11 and 23, respectively. The electrodes of array 12 include a sample gate electrode 36, a sample well electrode 38 and a sequence of storage cell electrode pairs 40. The sample gate and sample well electrodes, together with the portions of insulation layer 14 and substrate 16 therebelow, form sample gate and sample well cells 11 and 13 of FIG. 1. Similarly, each electrode pair 40, along with the portion of insulation layer 14 and substrate 16 therebelow, comprises a separate storage cell 19 or 21 of FIG. 1. When SPSCCD 10 samples the input signal applied to contact 30 above input diffusion region 11, a packet of charge is stored in channel region 18 under sample gate electrode 36. The charge packet thereafter shifts laterally from cell-to-cell through channel region 18.

The present invention relates in particular to improvements in individual storage cells 19 of first row 15 of FIG. 1 that enable them to quickly and efficiently transfer charge packets to neighboring storage cells selectively in either of two lateral directions when frequencies of clock signals P1, P2 and Ti are high. To simplify understanding of the invention, a typical storage cell of the prior art commonly employed in an SPSCCD in lieu of storage cell 19 of FIG. 1 is first described.

Figure 3A:
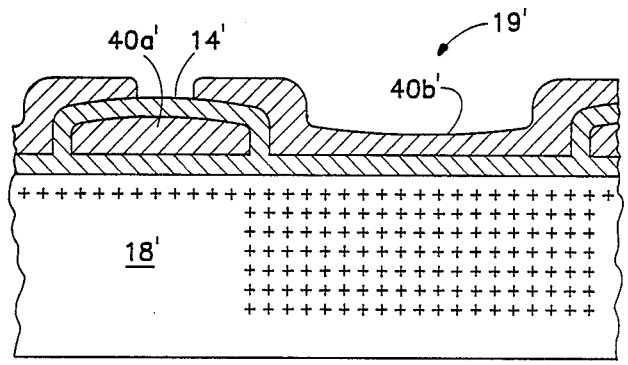
FIG. 3A is a sectional view of a prior art single storage cell of a two-phase SPSCCD.

As illustrated in FIG. 3A, the prior art storage cell 19' includes a polysilicon electrode pair 40a'/40b' insulated from a doped n-type channel region 18' by a silicon dioxide insulation layer 14'. Although not shown in FIG. 3A, electrodes 40a' and 40b' are interconnected by a metallic contact layer receiving the same clock signal P1. The "+" symbols represent relative dopant density (rather than depth) in the buried channel region 18' as a function of horizontal position along the channel. The dopant densities in the channel region under each electrode 40a' and 40b' are uniform in horizontal directions, but the dopant density under electrode 40b' is much higher than the dopant density under electrode 40a'. In an SPSCCD of the prior art, storage cells 21 and 25 of FIG. 1 are implemented by storage cells similar to storage cell 19' of FIG. 3A.

Figure 3B:
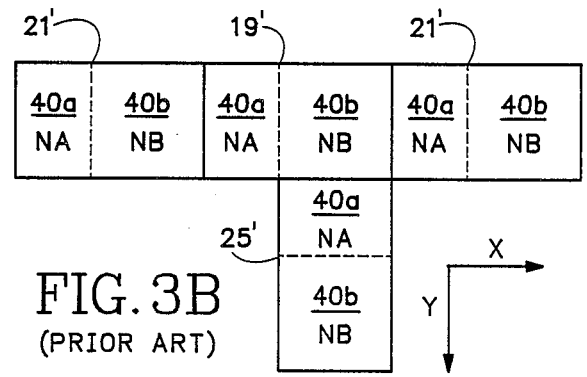
FIG. 3B is a diagrammatic planar view of a portion of a two-phase SPSCCD showing channel dopant concentration in portions of each storage cell.

FIG. 3B is a plan view of one storage cell 19' and portions of adjacent storage cells 21' and 25' of a prior art SPSCCD showing relative dopant concentrations within the channel regions of each cell. In storage cell 19' the dopant concentration in the channel region is a first constant NA under electrode 40a' and a second, higher constant NB under electrode 40b of FIG. 3A. Cells 21' have a similarly stepped dopant concentration in the lateral "X" direction of carrier flow. The stepped channel dopant density in each storage cell causes a stepped built-in channel potential preventing charge carriers in each cell from flowing in the −X direction during serial shift in operations. The term "channel potential" as used herein refers to potential of charge carriers in the channel rather than to voltage of the channel itself. Cell 25' is similar to cells 19' and 21' but is rotated so that it has a stepped dopant concentration in the lateral "Y" direction. The stepped dopant concentration prevents carriers from flowing through cell 25' in the −Y direction during parallel, row-to-row shift operations.

Figure 4:
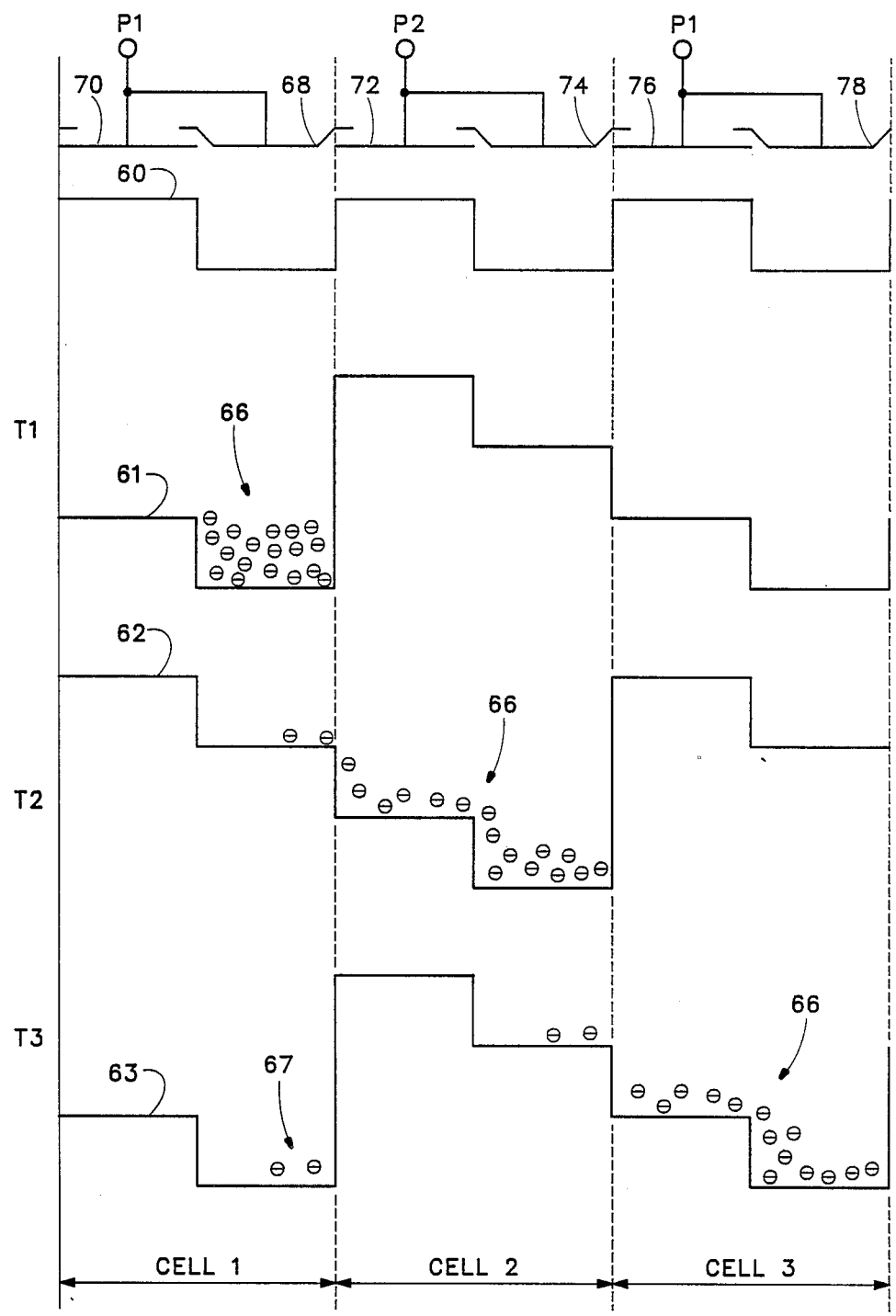
FIG. 4 is a diagram illustrating charge transfer in a two phase SPSCCD formed by prior art storage cells similar to the cells of FIG. 3B.

FIG. 4 illustrates how charge carriers are shifted through three adjacent prior art storage cells 21'-19'-21' of the type illustrated in FIGS. 3A and 3B. A simplified sectional view of the three storage cells (cells 1-3) is illustrated at the top of FIG. 4. In a two-phase SPSCCD, two opposite phase clock signals P1 and P2 drive electrodes of adjacent storage cells in an alternating fashion. Clock signal P1 controls electrodes of cells 1 and 3, while clock signal P2 controls electrodes of cell 2. FIG. 4 includes a plot 60 of the built-in channel potential of each cell as a function of horizontal distance along the lateral path of carrier flow in the channel. The "built-in" channel potential is the relative potential of the channel when no clock signals are applied to the gates and no charge packets are stored at any point in the channel. Due to the stepped channel doping profile as illustrated in FIG. 3A, the built-in channel potential is constant and relatively high under one electrode of each cell (i.e., electrodes 70, 72 and 76), and constant but relatively low under the other electrode of each cell (electrodes 68, 74, and 78).

FIG. 4 also includes plots 61–63 of relative channel potential as a function of lateral distance along the channel at three different times T1–T3 during movement of a charge packet through the cells. At time T1 clock signal P1 is asserted and clock signal P2 is deasserted. Clock signal P1 drives channel potentials across cells 1 and 3 to low levels, while the channel potentials across cell 2 rise to high levels. Cell 1 stores a packet of charge carriers 66 under electrode 68. The high potential gradients between areas of the channel under electrodes 70 and 68 of cell 1 and between the channel under electrode 72 of cell 2 and the channel under electrode 68 of cell 1 generate electric fields preventing carriers 66 from leaving the "potential well" under electrode 68.

Between times T1 and T2, clock signal P2 is asserted and clock signal P1 is deasserted. As clock signal P1 is deasserted, the channel potentials of cells 1 and 3 rise back to high levels. At the same time, clock signal P2 drives down channel potentials of cell 2. Carriers 66 drift and diffuse from the channel area under electrode 68 of cell 1 through the channel under electrode 72 of cell 2 and into the channel under electrode 74. At time T2, carriers are flowing from cell 1 to cell 2. Shortly after time T2, clock signals P1 and P2 again switch states, thereby driving channel potentials of cells 1 and 3 low while permitting channel potentials in cell 2 to rise. Thereafter, the carriers drift and diffuse from cell 2 through the channel under electrode 76 of cell 3 and into the channel under electrode 78. FIG. 4 shows carriers 66 at time T3 flowing from cell 2 to cell 3 while clock signal P1 is asserted.

When charge carriers begin to flow from one storage cell to another shortly after clock signals change state, the clock-induced potential gradient between channel regions of adjacent storage cells provides a strong electric field causing carriers to drift quickly into the receiving cell. A high initial carrier concentration gradient between adjacent cells also encourages carriers to flow by diffusion. However, near the end of a clock phase, as charge carriers accumulate in the receiving cell, both the carrier concentration gradient and the potential gradient between the channel regions of adjacent cells decrease. Accordingly, the forces on carriers that cause them to drift or diffuse into the receiving storage cell decrease and lateral carrier velocity begins to decline. As the frequency of clock signals controlling the electrodes of an SPSCCD increases, the time available for all charge carriers to move from a storage cell to its neighbor decreases. At high clocking frequencies, a substantial number of charge carriers remain behind at the end of a clock phase. FIG. 4, for example, shows two carriers 67 trapped in cell 1 at time T3. Although FIG. 4 illustrates charge packet transfer in the X direction through the sequence of storage cell types 21'-19'-21 of FIG. 3B, charge packet transfer in the Y direction from cell 19' to cell 25' is substantially similar.

The "charge transfer efficiency" of an SPSCCD is the ratio of charge transferred to a storage cell from its neighbor cell during a clock phase to the initial charge stored by its neighbor cell at the beginning of the clock cycle. As the frequency of operation of an SPSCCD increases, charge transfer efficiency decreases because less time is available for charge carrier movement during each clock phase. A high charge transfer efficiency is necessary, particularly in SPSCCDs having many storage cells, to prevent substantial degradation of charge packets passing from cell-to-cell through the SPSCCD. The charge transfer efficiency of an SPSCCD therefore limits the frequency of operation of an SPSCCD.

Figure 5A:
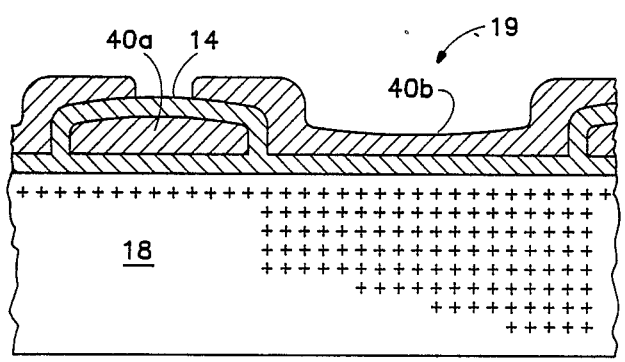
FIG. 5A is a sectional view of a single storage cell of a two-phase SPSCCD exhibiting graded channel dopant concentration in accordance with the present invention.
Figure 5B:
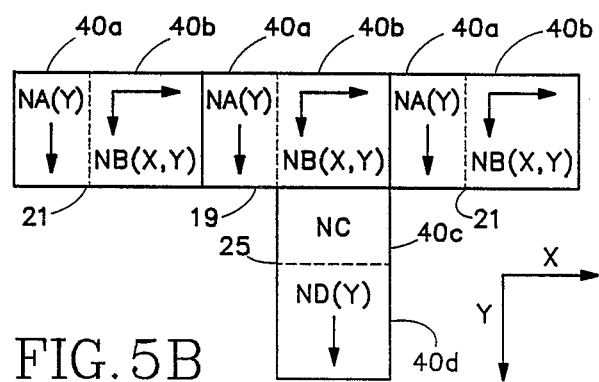
FIG. 5B is a diagrammatic planar view of a portion of the two-phase SPSCCD of FIG. 1 exhibiting graded channel dopant concentration in accordance with the present invention.

FIG. 5A is a section view of an improved storage cell 19 in accordance with the present invention. FIG. 5B is a simplified plan view of one storage cell 19 of FIG. 1 and neighboring storage cells 21 and 25 of FIG. 2 showing relative dopant concentrations within the channel regions of each cell. Arrows in cells 19, 21 and 25 show directions of increasing channel region dopant concentration within rectangular portions of the cells under electrodes 40a and 40b. Note that in cell 19, under electrode 40a, dopant concentration is a function NA(Y) of distance in the Y direction. Under electrode 40b of FIG. 5A, dopant concentration is a function NB(X,Y) of distance in both the X and Y directions.

Cell 19 of FIGS. 5A and 5B differs from the prior art storage cell 19' of FIGS. 3A and 3B. While the prior art cell 19' has a substantially constant dopant concentration under each electrode 40a' and 40b', cell 19 of the present invention has graded dopant concentrations under corresponding electrodes 40a and 40b. The graded doping concentration under electrode 40b of cell 19 provides a built-in electric field that drives carriers toward the adjacent cell 21 and also toward cell 25. The doping concentration under electrode 40a of cell 19 is graded in the Y direction with the same slope that the channel doping concentration under electrode 40b is graded in the Y direction. However, portions of the channel under electrode 40b are more heavily doped than adjacent portions under electrode 40a. This creates a uniformly stepped dopant concentration gradient in the channel along the X axis thereby creating a uniformly stepped potential gradient preventing carriers from flowing in the −X direction. Cells 21 are similar to cell 19.

Storage cell 25 has a uniform channel region dopant concentrations NC under electrode 40c and dopant concentration ND(Y) graded in one lateral direction (Y) of carrier flow under electrode 40d. The graded dopant concentration causes a built-in electric field driving carriers in the Y direction only. The step in channel dopant concentration in cell 25 causes a stepped built-in channel potential preventing charge carriers from flowing in the −Y direction. (A storage cell similar to cell 25 having a built-in potential graded in one direction is described and claimed in the co-pending U.S. patent application entitled "Tilted Channel Charged-Coupled Device", referenced hereinabove.)

Figure 6:
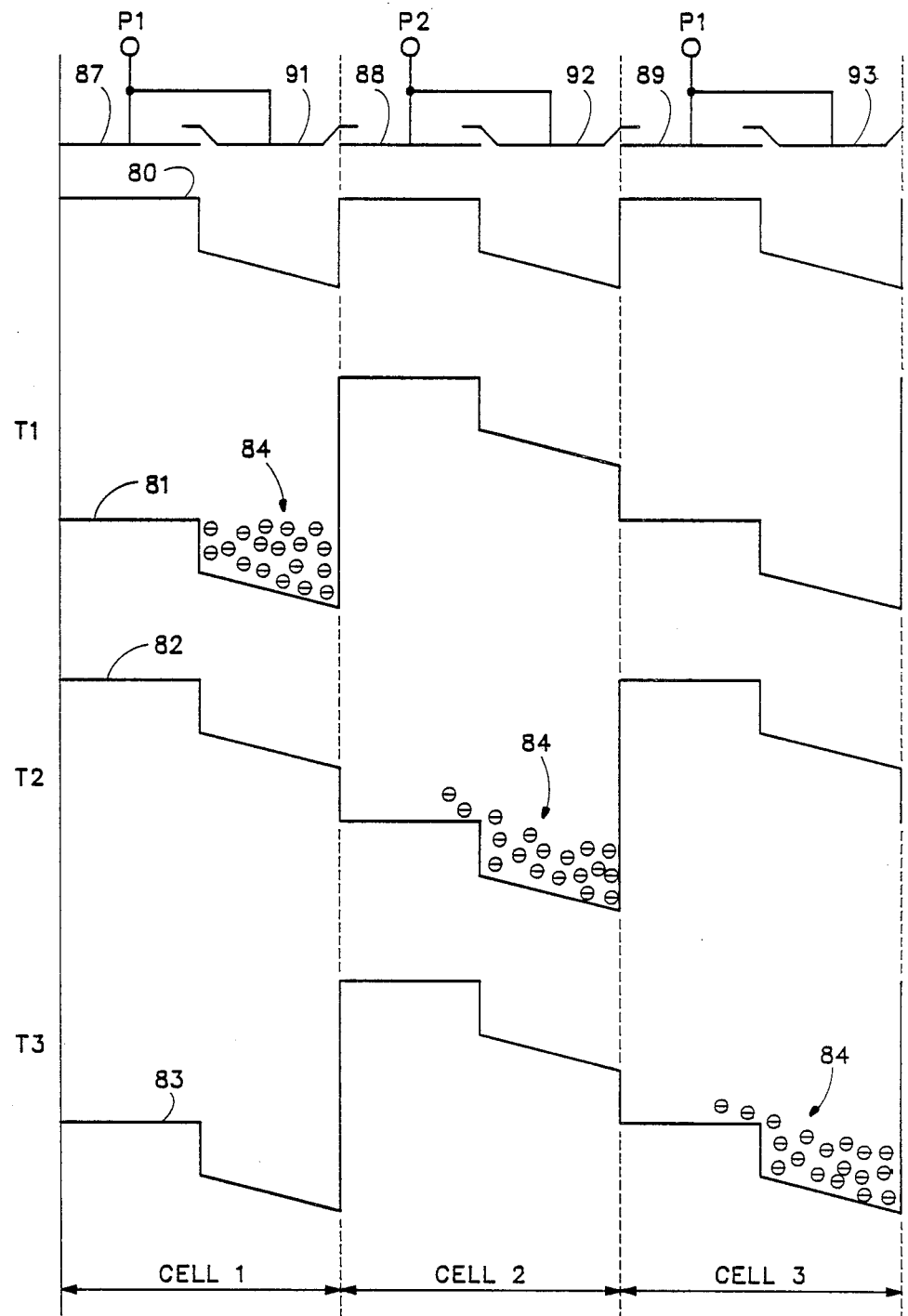
FIG. 6 is a diagram illustrating charge transfer in a two-phase, charge-coupled device formed by storage cells similar to the cells of FIG. 5B.

FIG. 6 is similar to FIG. 4 but illustrates channel potentials and charge carrier packet 84 movement in the X direction through the sequence of storage cell types 21-19-21 of FIG. 5B, labeled respectively as cells 1, 2 and 3 in FIG. 6. The built-in channel potentials of the cells are illustrated by plot 80. Note that in the X direction, the built-in channel potential is uniformly high under the first electrode of each cell (i.e., electrodes 87–89) but lower and tilted under the other electrode of each cell (i.e., electrodes 91–93).

FIG. 6 also includes three plots 81–83 showing channel potential at times T1–T3 during lateral movement of charge packet 84 through the channels of cells 1–3 in response to clock signals P1 and P2. The channel region under electrodes 91–93 of cells 1, 2 and 3 of FIG. 6 have tilted potential gradients in the lateral X direction, each creating an electric field applying a lateral force on charge carriers within the channel regions under electrodes 91–93. The electric field created by the tilted potential gradient increases carrier drift rate in the lateral X direction. The increase in carrier drift rate is particularly noticeable near the end of a clock phase when carrier concentration and clock-induced potential gradients between neighboring cells are reduced. The additional electric field provided by the tilted potential gradient helps sweep the last few carriers out of a cell during the latter portions of a clock phase when other carrier driving forces are low, thereby substantially improving charge transfer efficiency at higher clock frequencies. Although FIG. 6 illustrates charge transfer in the X direction through the sequence of cell types 21-19-21 of FIG. 5B, charge transfer in the Y direction from cell 19 to cell 25 is substantially similar because dopant concentrations in cells 19 and 25 are similarly graded in the Y direction.

Figure 7:
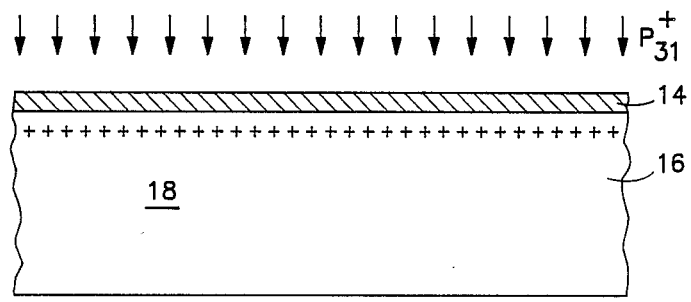
FIGS. 7–12 are sectional views illustrating various stages of fabrication of the storage cell of FIG. 5A.
Figure 8:
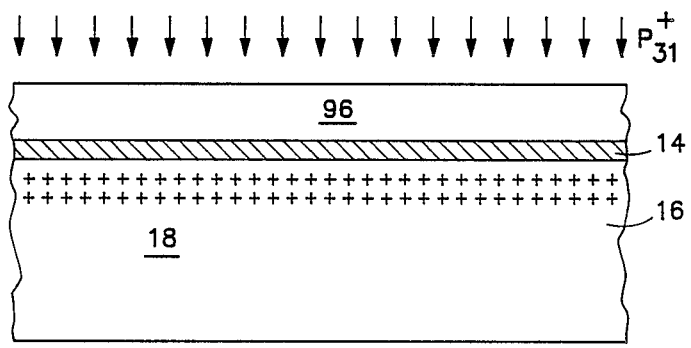
Figure 9:
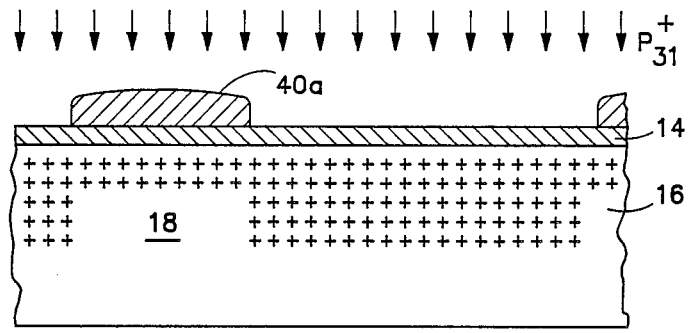
Figure 10:
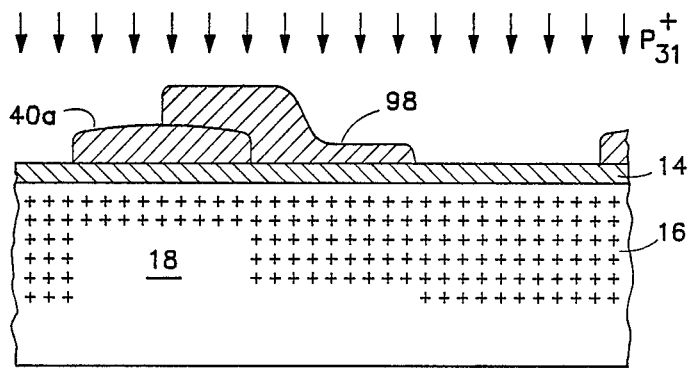

FIGS. 7-17 illustrate steps of a method for fabricating the buried channel storage cell 19 of FIG. 4 having channel dopant concentration graded in both the X and Y directions. FIGS. 7-12 are section views of the cell taken along the X direction. FIGS. 13-17 are simplified planar views of the cell 19 showing relative dopant concentrations in areas of the channel region during fabrication. The insulation layer 14 is grown on silicon substrate 16, and the channel region 18 of the p-type silicon substrate 16 is initially doped to a concentration N1 by implanting dopant ions such as $P_{31}{}^+$ at a controlled depth in the substrate (FIGS. 7 and 13). A mask 96 covers a portion of layer 14, and additional ions are implanted, thereby increasing the dopant concentration in an area of channel region 18 not covered by mask 96 (FIG. 8 and 14). Mask 96 is then stripped, the first polysilicon cell electrode 40a is formed on insulation layer 14, and additional dopant ions are implanted into the portion of channel region 18 not under electrode 40a, thereby raising the concentrations therein to N3 and N4 (FIGS. 9 and 15). Another mask 98 is placed above one end of electrode 40a and extending in the X direction over adjacent portions of insulation layer 14, and $P_{31}{}^+$ ions are again implanted in the substrate to increase dopant concentration in the portions of the channel not under electrode 40a or mask 96 to N5 and N6 (FIGS. 10 and 16).

Figure 11:
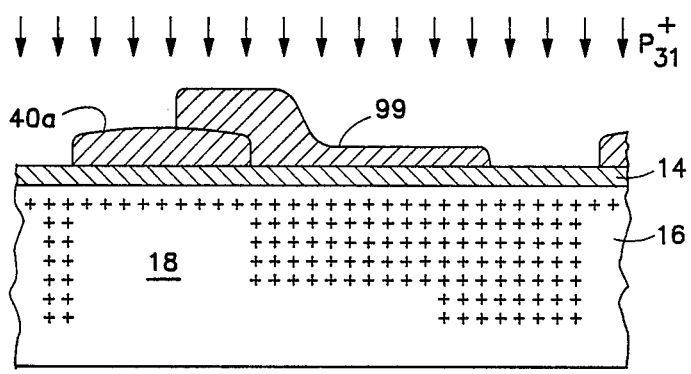
Figure 12:
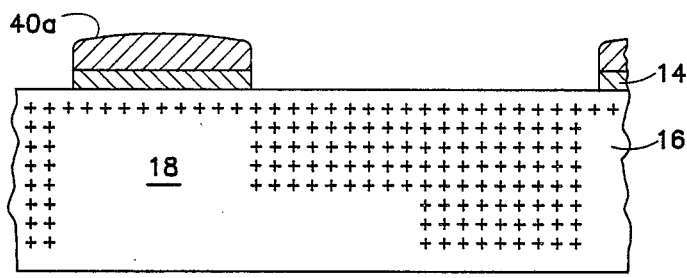

Mask 98 is then removed and replaced with a similar mask 99 laterally extending farther in the X direction from electrode 40a. The dopant concentration of the portion of channel region 18 still unmasked is further increased to N7 and N8 by additional ion implantation (FIGS. 11 and 17). When the desired dopant concentration gradient in the channel has been achieved by repetitively masking and doping the substrate, the last mask and the portion of insulation layer 14 not under electrode 40a are removed (FIG. 12). The insulation layer 14 is then regrown on the exposed surface of the substrate as well as over the upper surface of electrode 40a, and an additional electrode 40b is formed on insulation layer 14 to produce the resulting storage cell 19 illustrated in FIG. 5A.

The tilted built-in channel potential may be produced by non-uniformly doping the channel as illustrated in FIGS. 7-17 in accordance with a preferred embodiment of the invention. However, the built-in channel potential of a storage cell is a function not only of the dopant concentration in the channel region, but also of dopant depth, of the thickness of the insulation layer between the electrode and substrate, of the thickness of the channel region, and of the work function of the electrode. Accordingly, those skilled in the art will understand that in alternative embodiments the built-in channel potential of a storage cell can be tilted by grading the dopant depth in the channel region, by grading the thickness of the insulation layer, by grading the thickness of the channel region, or by providing a cell electrode having a graded work function.

FIGS. 18 and 19 illustrate a storage cell 100 in accordance with an alternative embodiment of the invention wherein the built-in potential is graded under electrodes 40a and 40b by grading the thickness of the insulation layer 14. The thickness of insulation layer 14 may be graded by repetitively masking and oxidizing selected portions of the substrate 16 before the electrodes are formed.

Figure 20:
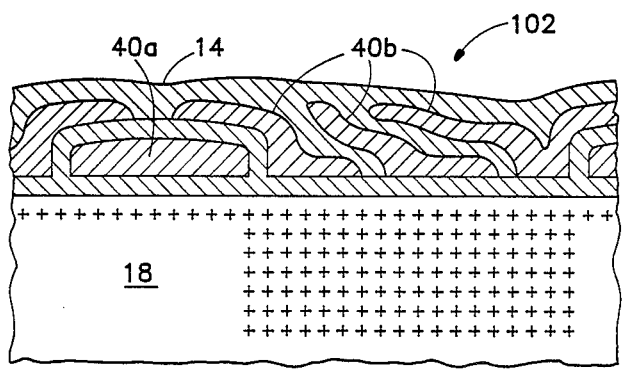
FIG. 20 is a sectional view of a single storage cell of an SPSCCD utilizing an electrode having a graded electrode work function in accordance with an alternative embodiment of the present invention.
Figure 21:
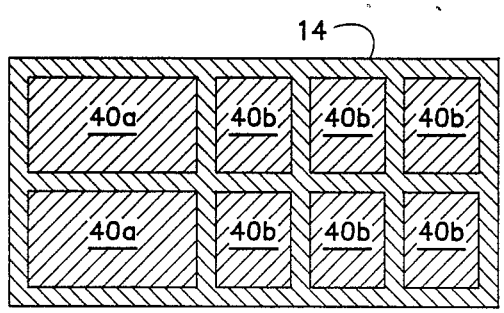
FIG. 21 is a diagrammatic planar view of the storage cell of FIG. 18.

FIGS. 20 and 21 illustrate a storage cell 102 in accordance with another alternative embodiment of the invention wherein the built-in potential is graded under electrodes 40a and 40b by grading the work function of the electrodes. This may be accomplished by forming electrodes 40a and 40b in several sections, each section having a different work function. The separate sections of electrodes 40a and 40b are all connected to the same clock signal by a metallic layer (not shown).

A graded channel potential can also be obtained by providing graded clock signal potentials to the electrodes. For example, yet another alternative embodiment of the invention has a sectioned electrode as in FIGS. 20 and 21. However, the electrode sections are not interconnected and have similar work functions. To provide a tilted channel potential, a separate clock signal controls each electrode 40a and 40b section, the clock signals being of the same phase but having differing voltage magnitudes.

Figure 22:
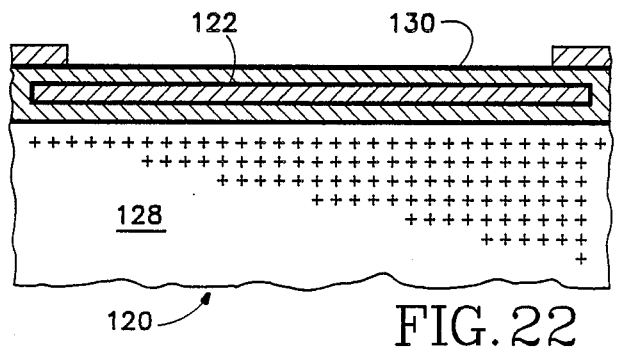
FIG. 22 is a sectional view of a single storage cell of a multiple phase, serial-parallel-serial, charge-coupled device showing a graded channel dopant concentration in accordance with an alternative embodiment of the present invention.
Figure 23:
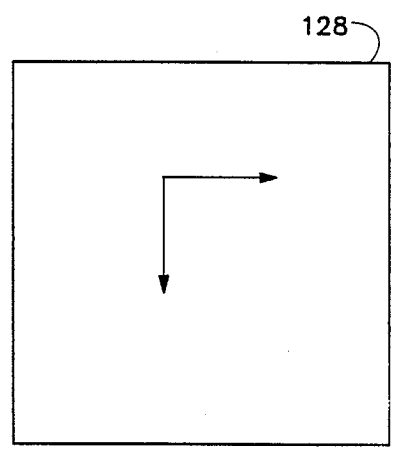
FIG. 23 is a diagrammatic planar view of the storage cell of FIG. 22 showing directions of channel dopant concentration gradation.

The storage cell 19 of FIG. 5A is suitable for use in a two-phase, buried channel SPSCCD. However, alternative embodiments of the invention may be employed in multiple phase SPSCCDs employing three or more clock signal phases. In SPSCCDs of the prior art employing more than two clock phases, the channel potential gradient in each storage cell is substantially flat over substantially all its length in the direction of lateral carrier flow. A stepped channel potential is not needed to prevent carrier back flow. FIGS. 22 and 23 illustrate a single storage cell 120 in accordance with the invention suitable for use in a multiple phase SPSCCD at the junction between a row and a column of a storage cell array where charge packets may selectively shift along a row in the X direction or along a column in the Y direction. In storage cell 120 the built-in potential gradient in channel region 128 is tilted throughout the length of the cell in both X and Y directions under a single electrode 122 and insulation layer 130 by grading the channel dopant concentration over the entire length of the cell in both directions. FIG. 22 is a section view of the cell showing the graded dopant concentration in the X direction. The dopant concentration is similarly graded in the Y direction. FIG. 23 is a plan view of storage cell 120 of FIG. 23 with arrows showing direction of dopant grading. By tilting the channel potential gradient in the cell in accordance with the present invention, a resulting electric field applies a lateral force on charge carriers within the channel region increasing carrier drift, thereby substantially improving charge transfer efficiency, particularly at higher clock frequencies.

While preferred and alternative embodiments of the present invention have been shown and described, it will be apparent to those skilled in the art that many changes and modifications may be made without departing from the invention in its broader aspects. The appended claims are therefore intended to cover all such changes and modifications as fall within the true spirit and scope of the invention.

We claim:

1. A charge storage cell for a serial-parallel-serial, charge-coupled device for storing charge carriers and for transferring stored charge carriers in two, non-parallel lateral directions toward two neighboring charge storage cells of the charge-coupled device, the charge storage cell comprising:
- a semiconductor substrate;
- an insulator layer formed above said substrate; and
- an electrode formed above said insulator layer, the substrate including a channel region coextensive with said electrode in the two lateral directions for storing charge carriers and for conducting charge carriers under said electrode in the two lateral directions,
- a substantial portion of said channel region having built-in potential gradients tilted in the two lateral directions, and
- the tilted built-in potential gradients providing electric fields applying forces in the two lateral directions on charge carriers within said substantial portion of said channel region.

2. The charge storage cell in accordance with claim 1 wherein said substantial portion of said channel region has a dopant concentration graded in said two lateral directions.

3. The charge storage cell in accordance with claim 1 wherein said insulator layer has a vertical thickness graded in said two lateral directions.

4. The charge storage cell in accordance with claim 1 wherein said electrode has a work function graded in said two lateral directions.

5. The charge storage cell in accordance with claim 1 wherein said channel region is a buried channel region.

6. A charge storage cell for a serial-parallel-serial, charge-coupled device for storing charge carriers and for transferring stored charge carriers in two, non-parallel lateral directions toward two neighboring charge storage cells of the charge-coupled device, the charge storage cell comprising:
- a semiconductor substrate;
- an insulator layer formed above said substrate; and
- a plurality of laterally spaced electrodes formed above said insulator layer, isolated one from another and driven to differing potentials,
- the substrate including a channel region coextensive with said electrode in the two lateral directions for storing charge carriers and for conducting charge carriers under said electrode in the two lateral directions,
- said potentials differing such that a substantial portion of said channel region has potential gradients tilted in the two lateral directions, and
- the tilted potential gradients providing electric fields applying forces in the two lateral directions on charge carriers within said substantial portion of said channel region.

7. A charge storage cell for a serial-parallel-serial, charge-coupled device for storing charge carriers and for transferring stored charge carriers in two, non-parallel lateral directions toward two neighboring charge storage cells of the charge-coupled device, the charge storage cell comprising:
- a semiconductor substrate;
- an insulator layer formed above said substrate; and
- an electrode formed above said insulator layer, the substrate including a channel region coextensive with said electrode in the two lateral directions for conducting charge carriers in the two lateral directions,
- a substantial first portion of the channel region having a substantially constant potential gradient in at least one of said two lateral directions, and
- a substantial second portion of said channel region having potential gradients tilted in said two lateral directions.

8. The charge storage cell in accordance with claim 7 wherein the tilted potential gradients provide electric fields applying forces in said two lateral directions on the charge carriers within the second portion of the channel region.

9. The charge storage cell in accordance with claim 7 wherein a built-in potential difference between said first and second portions of said channel region provides an electric field accelerating charge carriers therebetween in a direction from said first portion of said channel region to said second portion of said channel region.

10. The charge storage cell in accordance with claim 7 wherein said second portion of said channel region has dopant concentrations graded in said two lateral directions.

11. The charge storage cell in accordance with claim 7 wherein a portion of said insulator layer above said second portion of said channel region is of a thickness graded in said two lateral directions.

12. The charge storage cell in accordance with claim 7 wherein a work function of a portion of said electrode above said second portion of said channel region is graded in said two lateral directions.

13. The charge storage cell in accordance with claim 7 wherein said channel region is a buried channel region.

14. A serial-parallel-serial, charge-coupled device comprising:
- an array of intersecting horizontal rows and columns of closely spaced charge storage cells,
- each charge storage cell comprising an electrode covering an insulation layer above a semiconductor substrate,
- the semiconductor substrate of each charge storage cell including a channel region for conducting carriers laterally through the charge storage cell, and
- a substantial portion of the channel region of at least one charge storage cell forming an intersection of a row and a column of the array having tilted built-in potential gradients providing an electric field facilitating lateral charge carrier drift within said substantial portion of said channel region in two lateral directions defined by orientations of said row and said column.

15. The charge-coupled device in accordance with claim 14 wherein a dopant concentration in said substantial portion of said channel region is graded in said two lateral directions.

* * * * *